United States Patent
Chang et al.

(10) Patent No.: US 12,002,539 B2
(45) Date of Patent: Jun. 4, 2024

(54) MEMORY DEVICE AND MEMORY ARRAY STRUCTURE USING CHARGE SHARING FOR MULTI-BIT CONVOLUTIONAL NEURAL NETWORK BASED COMPUTING-IN-MEMORY APPLICATIONS, AND COMPUTING METHOD THEREOF

(71) Applicant: NATIONAL TSING HUA UNIVERSITY, Hsinchu (TW)

(72) Inventors: Meng-Fan Chang, Hsinchu (TW); Yen-Chi Chou, Hsinchu (TW); Jian-Wei Su, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 975 days.

(21) Appl. No.: 16/985,205

(22) Filed: Aug. 4, 2020

(65) Prior Publication Data

US 2022/0044714 A1 Feb. 10, 2022

(51) Int. Cl.
| | | |
|---|---|---|
| G11C 11/54 | (2006.01) | |
| G11C 5/06 | (2006.01) | |
| G11C 7/10 | (2006.01) | |
| G11C 7/12 | (2006.01) | |
| G11C 8/08 | (2006.01) | |
| G11C 8/16 | (2006.01) | |
| G11C 11/419 | (2006.01) | |

(52) U.S. Cl.
CPC ............. *G11C 7/12* (2013.01); *G11C 5/06* (2013.01); *G11C 7/1006* (2013.01); *G11C 8/08* (2013.01); *G11C 8/16* (2013.01); *G11C 11/419* (2013.01); *G11C 11/54* (2013.01)

(58) Field of Classification Search
CPC .......... G11C 7/12; G11C 5/06; G11C 7/1006; G11C 8/08; G11C 8/16; G11C 11/419; G11C 11/54
See application file for complete search history.

(56) References Cited

U.S. PATENT DOCUMENTS

| | | | | |
|---|---|---|---|---|
| 10,748,603 | B2 * | 8/2020 | Sumbul | G06N 3/065 |
| 11,048,434 | B2 * | 6/2021 | Kumar | G06F 3/0659 |
| 2021/0125663 | A1 * | 4/2021 | Chang | G06N 3/045 |
| 2021/0286755 | A1 * | 9/2021 | Vorbach | G06F 9/345 |
| 2021/0295905 | A1 * | 9/2021 | Lee | G06F 12/0607 |

\* cited by examiner

*Primary Examiner* — Jay W. Radke
(74) *Attorney, Agent, or Firm* — CKC & Partners Co., LLC (57) ABSTRACT

A memory unit includes at least one memory cell and a computational cell. The at least one memory cell stores a weight. The at least one memory cell is controlled by a first word line and includes a local bit line transmitting the weight. The computational cell is connected to the at least one memory cell and receiving the weight via the local bit line. Each of an input bit line and an input bit line bar transmits a multi-bit input value. The computational cell is controlled by a second word line and an enable signal to generate a multi-bit output value on each of an output bit line and an output bit line bar according to the multi-bit input value multiplied by the weight. The computational cell is controlled by a first switching signal and a second switching signal for charge sharing.

20 Claims, 11 Drawing Sheets

MEMORY DEVICE AND MEMORY ARRAY STRUCTURE USING CHARGE SHARING FOR MULTI-BIT CONVOLUTIONAL NEURAL NETWORK BASED COMPUTING-IN-MEMORY APPLICATIONS, AND COMPUTING METHOD THEREOF

BACKGROUND

Technical Field

The present disclosure relates to a memory unit, a memory array structure and a computing method thereof. More particularly, the present disclosure relates to a memory unit for a plurality of multi-bit convolutional neural network (CNN) based computing-in-memory (CIM) applications based on charge sharing, a memory array structure for the multi-bit CNN based CIM applications based on charge sharing and a computing method thereof.

Description of Related Art

In these years, due to the industrial growth of mobile device, medical electrical equipment, portable storage, etc., requirement of memory with low power, high speed and high density is increased. Computing-in-memory (CIM) is a promising solution to improve the energy efficiency of multiply-and-accumulate (MAC) operations for AI chips, and multiple-bit convolutional neural network (CNN) is required for high inference accuracy in many applications.

In CNN application, in order to get higher accuracy, high bit precision may be used to achieve the goal. Moreover, to decrease the latency, the number of operations can be increased in one cycle. However, high bit precision will decrease the speed and energy efficiency. Therefore, increasing the bit precision and the number of operations becomes the trends of CIM circuit nowadays, but it will cause lots of difficulties at the same time. First, in a conventional CIM static random access memory (SRAM) structure, when a bit line (BL) and a bit line bar (BLB) are discharged to perform the MAC operation, its power may be large and it may be vulnerable to timing variation. A conventional computing method of a voltage divider is insensitive to timing variation, but it will cause large DC current which decreases the energy efficiency. Second, a charge sharing is performed, a global capacitance may decrease the influence of a local capacitance so as to lower the sensing margin and cause sensing error. Third, when doing weight combination, the conventional CIM SRAM structure need extra 4× and 1× capacitance or 4× and 1× transistors to represent 4 times and 1 time weight, respectively, so as to cause area overhead. Fourth, when a 1-bit input operation is performed, one cycle is needed. When a n-bit input operation is performed, n cycles are needed. Hence, when the bit precision is high, lots of cycles are needed to perform the operation, thus causing high latency.

Accordingly, a memory unit for a plurality of multi-bit CNN based CIM applications based on charge sharing, a memory array structure for the multi-bit CNN based CIM applications based on charge sharing and a computing method thereof having the features of enhancing the operation speed with a pipeline technique and saving area and energy without extra capacitance and transistors are commercially desirable.

SUMMARY

According to one aspect of the present disclosure, a memory unit for a plurality of multi-bit convolutional neural network (CNN) based computing-in-memory (CIM) applications based on charge sharing is controlled by a first word line, a second word line, an enable signal, a first switching signal and a second switching signal. The memory unit for the multi-bit CNN based CIM applications based on charge sharing includes at least one memory cell and a computational cell. The at least one memory cell stores a weight. The at least one memory cell is controlled by the first word line and includes a local bit line transmitting the weight. The computational cell is connected to the at least one memory cell and receives the weight via the local bit line. The computational cell includes an input bit line, an input bit line bar, an output bit line and an output bit line bar. Each of the input bit line and the input bit line bar transmits a multi-bit input value. The computational cell is controlled by the second word line and the enable signal to generate a multi-bit output value on each of the output bit line and the output bit line bar according to the multi-bit input value multiplied by the weight, and the computational cell is controlled by the first switching signal and the second switching signal for charge sharing.

According to another aspect of the present disclosure, a memory array structure for a plurality of multi-bit CNN based CIM applications based on charge sharing is controlled by a first word line, a second word line, an enable signal, a first switching signal and a second switching signal. The memory array structure for the multi-bit CNN based CIM applications based on charge sharing includes a plurality of memory units connected to each other via the first word line and the second word line. Each of the memory units includes at least one memory cell and a computational cell. The at least one memory cell stores a weight. The at least one memory cell is controlled by the first word line and includes a local bit line transmitting the weight. The computational cell is connected to the at least one memory cell and receives the weight via the local bit line. The computational cell includes an input bit line, an input bit line bar, an output bit line and an output bit line bar. Each of the input bit line and the input bit line bar transmits a multi-bit input value. The computational cell is controlled by the second word line and the enable signal to generate a multi-bit output value on each of the output bit line and the output bit line bar according to the multi-bit input value multiplied by the weight, and the computational cell is controlled by the first switching signal and the second switching signal for charge sharing.

According to further another aspect of the present disclosure, a computing method of the memory array structure for the multi-bit CNN based CIM applications based on charge sharing is controlled by the first word line, the second word line, the enable signal, the first switching signal and the second switching signal. The computing method includes performing a voltage level applying step and a computing step. The voltage level applying step includes applying a plurality of voltage levels to the first word line, the second word line, the enable signal, the first switching signal, the second switching signal, the weight, the input bit line and the input bit line bar of each of the memory units, respectively. The computing step includes performing a multiply step. The multiply step includes driving the computational cell of each of the memory units to compute the voltage levels of the weight, the input bit line and the input bit line bar so as to generate the multi-bit output value on each of the output bit line and the output bit line bar according to the multi-bit input value multiplied by the weight.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details are unnecessary. In addition, for simplifying the drawings, some conventional structures and elements will be simply illustrated, and repeated elements may be represented by the same labels.

It will be understood that when an element (or device) is referred to as being "connected to" another element, it can be directly connected to the other element, or it can be indirectly connected to the other element, that is, intervening elements may be present. In contrast, when an element is referred to as being "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage GND. A PMOS transistor and an NMOS transistor represent a P-type MOS transistor and an N-type MOS transistor, respectively. Each transistor has a source, a drain and a gate.

Figure 1:
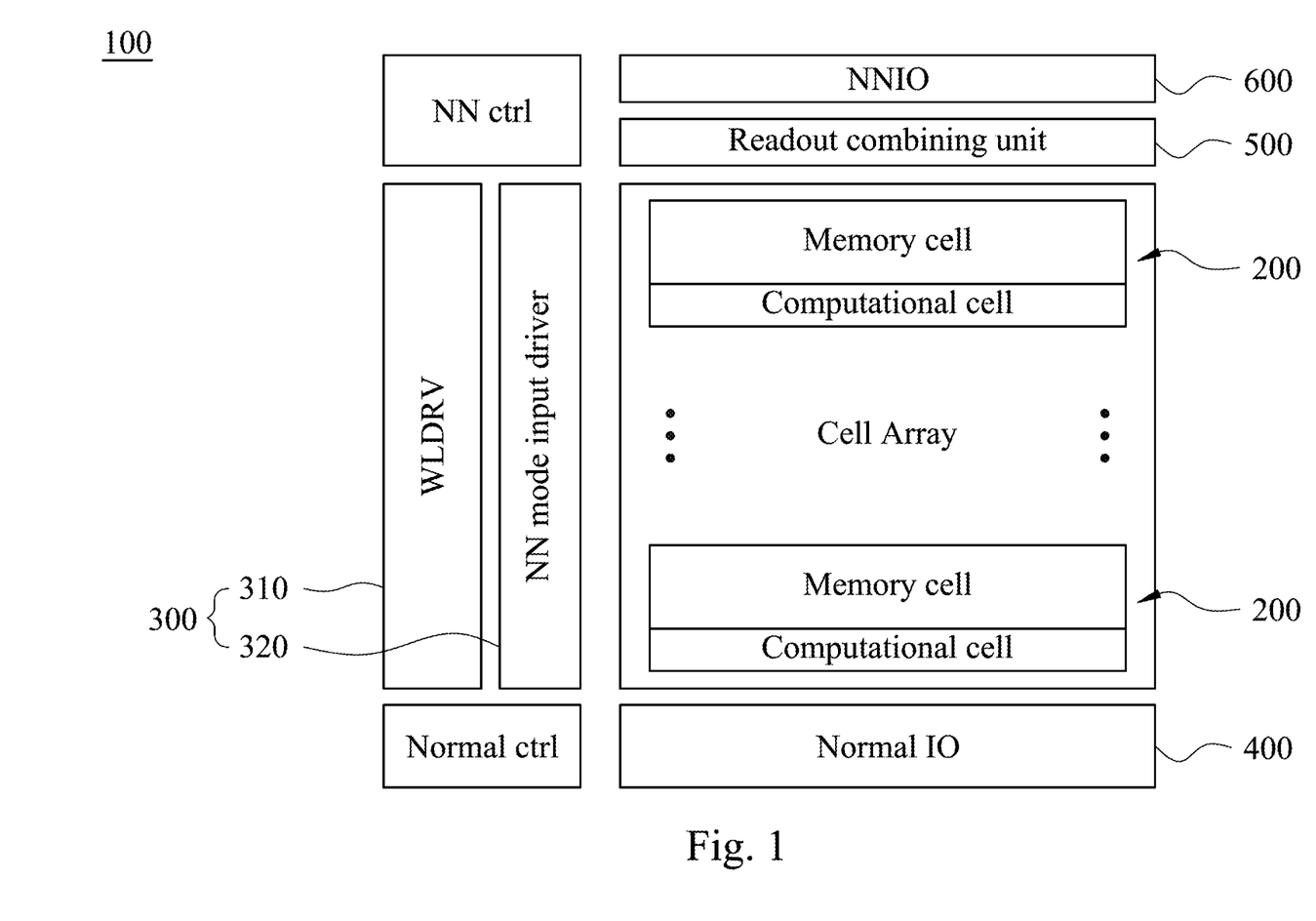
FIG. 1 shows a block diagram of a memory array structure for a plurality of multi-bit convolutional neural network based computing-in-memory applications based on charge sharing according to a first embodiment of the present disclosure.
Figure 2:
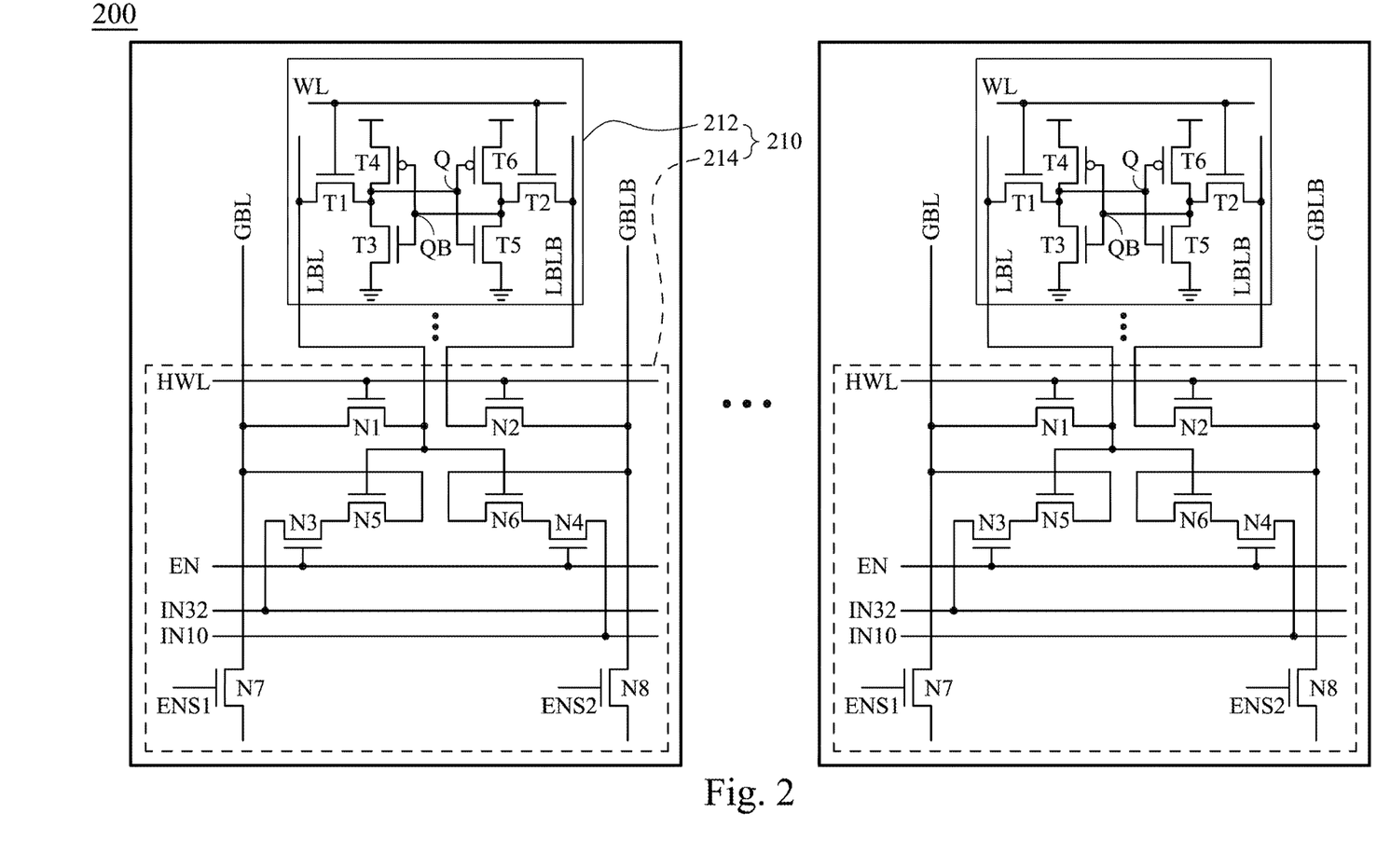
FIG. 2 shows a circuit diagram of one of a plurality of local memory array units of the memory array structure of FIG. 1.
Figure 3:
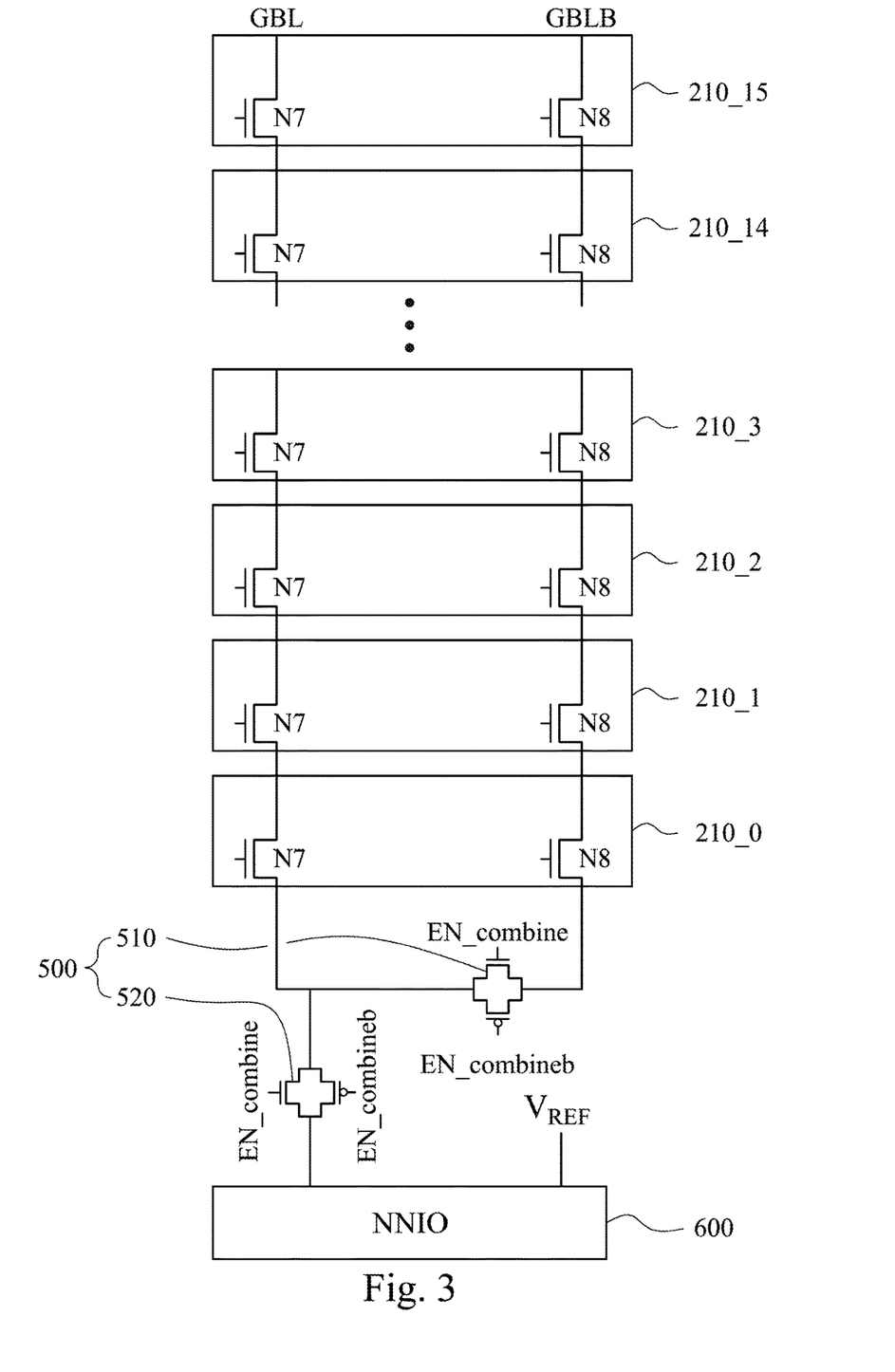
FIG. 3 shows a circuit diagram of a plurality of memory units, a readout combining unit and a CIM readout circuit of the memory array structure of FIG. 1.
Figure 4:
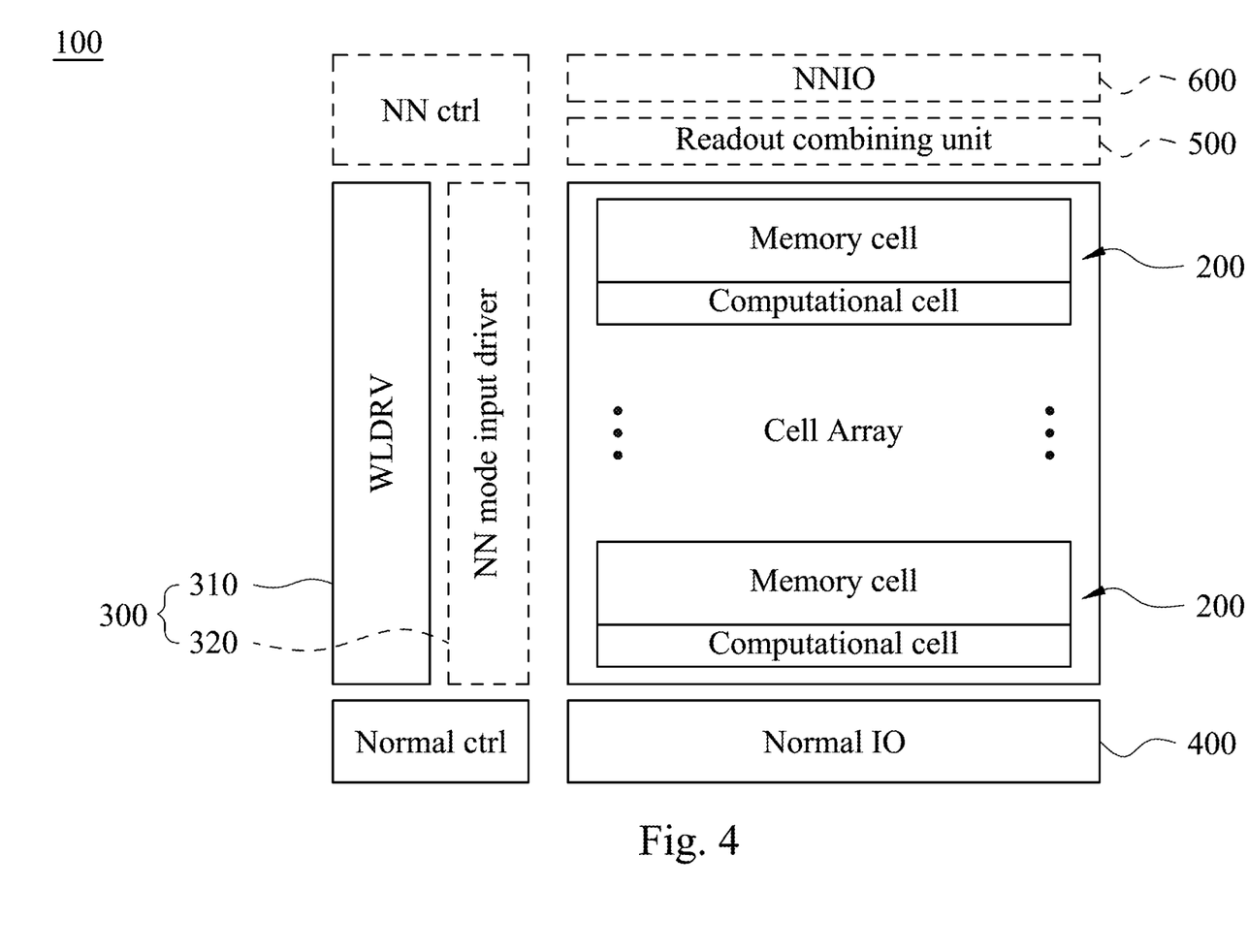
FIG. 4 shows one block diagram of the memory array structure for the multi-bit convolutional neural network based computing-in-memory applications based on charge sharing of FIG. 1, which is in a normal mode.
Figure 5:
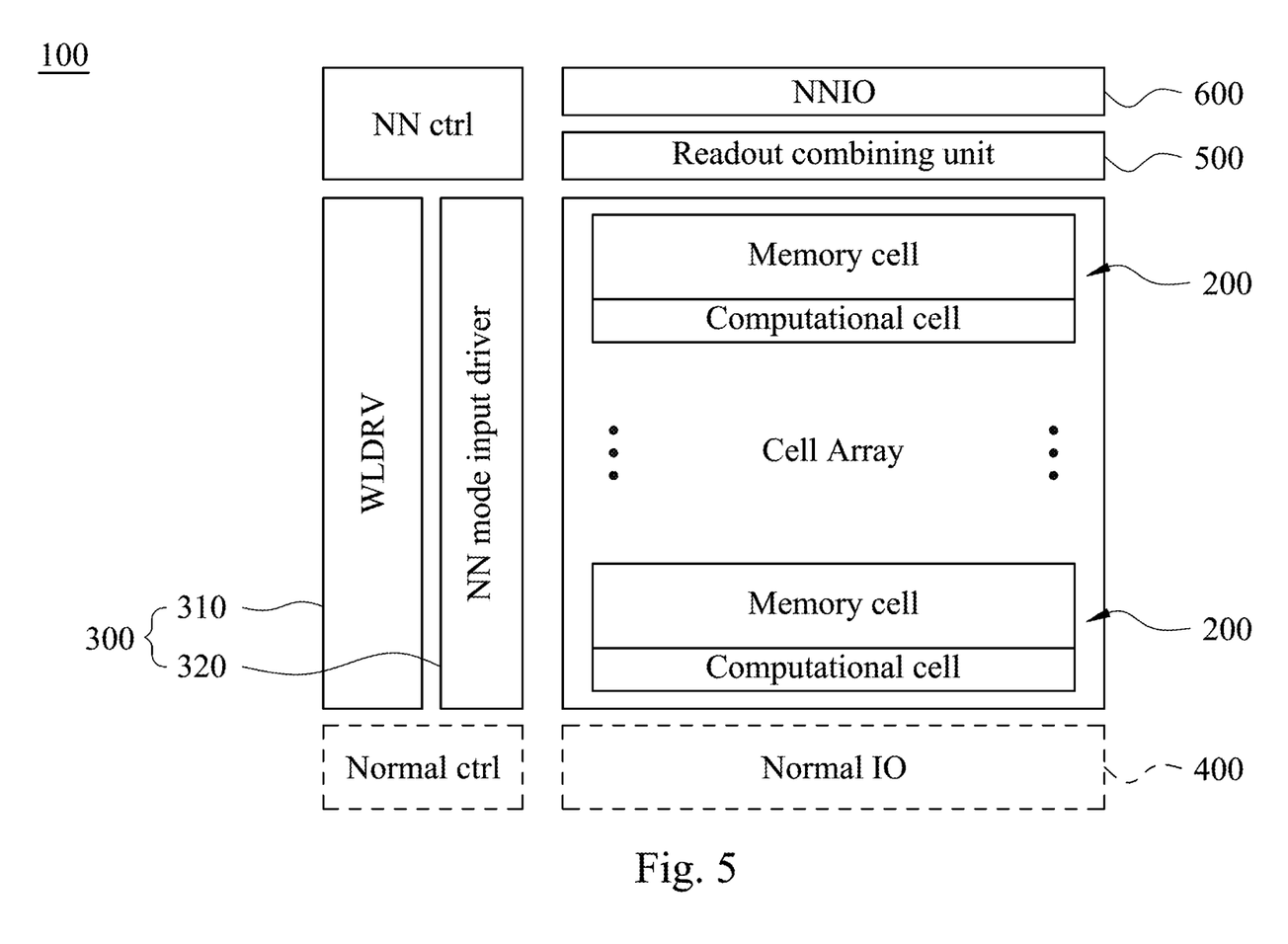
FIG. 5 shows another block diagram of the memory array structure for the multi-bit convolutional neural network based computing-in-memory applications based on charge sharing of FIG. 1, which is in a computing-in-memory mode.

FIG. 1 shows a block diagram of a memory array structure 100 for a plurality of multi-bit convolutional neural network (CNN) based computing-in-memory (CIM) applications based on charge sharing according to a first embodiment of the present disclosure. FIG. 2 shows a circuit diagram of one of a plurality of local memory array units 200 of the memory array structure 100 of FIG. 1. FIG. 3 shows a circuit diagram of a plurality of memory units 210_0-210_15, a readout combining unit 500 and a CIM readout circuit 600 of the memory array structure 100 of FIG. 1. FIG. 4 shows one block diagram of the memory array structure 100 for the multi-bit CNN based CIM applications based on charge sharing of FIG. 1, which is in a normal mode. FIG. 5 shows another block diagram of the memory array structure 100 for the multi-bit CNN based CIM applications based on charge sharing of FIG. 1, which is in a CIM mode. In FIGS. 1-5, the memory array structure 100 for the multi-bit CNN based CIM applications based on charge sharing is controlled by a first word line WL, a second word line HWL, an enable signal EN, a first switching signal ENS1 and a second switching signal ENS2. The memory array structure 100 for the multi-bit CNN based CIM applications based on charge sharing includes the local memory array units 200, an input driver module 300, a normal input-output (10) circuit 400, the readout combining unit 500 and the CIM readout circuit 600.

The local memory array units 200 are connected to each other. Each of the local memory array units 200 includes the memory units 210. The memory units 210 are connected to each other via the first word line WL and the second word line HWL. Each of the memory units 210 includes at least one memory cell 212 and the computational cell 214. In one embodiment, the number of the at least one memory cell 212 may be 16× (e.g., 16, 32, and so on).

The memory cell 212 stores a weight (1-bit weight). The memory cell 212 is controlled by the first word line WL. In detail, the memory cell 212 includes a first node Q, a second node QB, a local bit line LBL, a local bit line bar LBLB, a first memory cell transistor T1, a second memory cell transistor T2, a first inverter INV1 and a second inverter INV2. The first node Q stores the weight. The second node QB stores an inverted weight opposite to the weight of the first node Q. The local bit line LBL is connected to the computational cell 214 and transmits the weight from the memory cell 212 to the computational cell 214. The local bit line bar LBLB is connected to the computational cell 214 and transmits the inverted weight from the memory cell 212 to the computational cell 214. The first memory cell transistor T1 is connected to the first node Q, the local bit line LBL and the first word line WL. The second memory cell transistor T2 is connected to the second node QB, the local bit line bar LBLB and the first word line WL. The first inverter INV1 is located between the first node Q and the second node QB. The first inverter INV1 includes a third memory cell transistor T3 and a fourth memory cell transistor T4 connected to the third memory cell transistor T3.

The second inverter INV2 is connected to the first inverter INV1. The second inverter INV2 includes a fifth memory cell transistor T5 and a sixth memory cell transistor T6 connected to the fifth memory cell transistor T5. In other words, the memory cell 212 is a 6T static random access memory (SRAM) cell. Each of the first memory cell transistor T1, the second memory cell transistor T2, the third memory cell transistor T3 and the fifth memory cell transistor T5 is an NMOS transistor. Each of the fourth memory cell transistor T4 and the sixth memory cell transistor T6 is a PMOS transistor.

The computational cell 214 is connected to the memory cell 212 and receives the weight via the local bit line LBL. The computational cell 214 includes an input bit line IN32, an input bit line bar IN10, an output bit line GBL and an output bit line bar GBLB. Each of the input bit line IN32 and the input bit line bar IN10 transmits a multi-bit input value. The computational cell 214 is controlled by the second word line HWL and the enable signal EN to generate a multi-bit output value on each of the output bit line GBL and the output bit line bar GBLB according to the multi-bit input value multiplied by the weight, and the computational cell 214 is controlled by the first switching signal ENS1 and the second switching signal ENS2 for charge sharing.

In detail, a 4-bit horizontal input value IN[3:0] is applied to the computational cell 214. The multi-bit input value of the input bit line IN32 is a voltage level $V_{MSB}$ corresponding to IN[3:2], and the multi-bit input value of the input bit line bar IN10 is a voltage level $V_{LSB}$ corresponding to IN[1:0]. The computational cell 214 further includes a first computational cell transistor N1, a second computational cell transistor N2, a third computational cell transistor N3, a fourth computational cell transistor N4, a fifth computational cell transistor N5, a sixth computational cell transistor N6, a first sharing switch N7 and a second sharing switch N8. The first computational cell transistor N1 is connected to the second word line HWL, the output bit line GBL and the local bit line LBL. The second computational cell transistor N2 is connected to the second word line HWL, the output bit line bar GBLB and the local bit line bar LBLB. The third computational cell transistor N3 is connected to the enable signal EN, the input bit line IN32 and a first inner node. The fourth computational cell transistor N4 is connected to the enable signal EN, the input bit line bar IN10 and a second inner node. The fifth computational cell transistor N5 is connected to the local bit line LBL, the first inner node and the output bit line GBL. The sixth computational cell transistor N6 is connected to the local bit line LBL, the second inner node and the output bit line bar GBLB. The first sharing switch N7 is coupled to one end of the output bit line GBL. The first sharing switch N7 is controlled by the first switching signal ENS1 for charge sharing. The second sharing switch N8 is coupled to one end of the output bit line bar GBLB. The second sharing switch N8 is controlled by the second switching signal ENS2 for charge sharing. In addition, the multi-bit input value is an analog signal. The output bit line GBL and the output bit line bar GBLB are extended in a vertical direction (column). The first word line WL, the second word line HWL, the input bit line IN32 and the input bit line bar IN10 are extended in a horizontal direction (row). Each of the first computational cell transistor N1, the second computational cell transistor N2, the third computational cell transistor N3, the fourth computational cell transistor N4, the fifth computational cell transistor N5, the sixth computational cell transistor N6, the first sharing switch N7 and the second sharing switch N8 is the NMOS transistor. Table 1 lists the multi-bit input values, the weights and the multi-bit output values of the computational cell 214 of FIG. 2. The multi-bit output values can be computed by the multi-bit input values and the weights. The multi-bit input values represent the voltage level $V_{MSB}$ of the input bit line IN32 and the voltage level $V_{LSB}$ of the input bit line bar IN10, respectively. The multi-bit input values are corresponding to IN[3:2] and IN[1:0], respectively. Each of the input bit line IN32 and the input bit line bar IN10 may have four voltage levels which are equal to VDD (e.g., 0.9 V), Vinput10 (e.g., 0.6 V), Vinput01 (e.g., 0.3 V) and VSS (e.g., 0 V), respectively, i.e., each of the multi-bit input values may be VDD, Vinput10, Vinput01 or VSS. The weight is corresponding to the voltage level on the local bit line LBL. The multi-bit output values (i.e., "Input× Weight") are corresponding to the voltage level on the output bit line GBL and the output bit line bar GBLB, respectively. "ΔV" represents the voltage level on the output bit line GBL (or the output bit line bar GBLB) when the voltage level $V_{MSB}$ (or the voltage level $V_{LSB}$) is equal to Vinput01.

TABLE 1

| Input (IN32/IN10) | Input ($V_{MSB}/V_{LSB}$) | Weight (LBL) | Input × Weight (GBL/GBLB) |
|---|---|---|---|
| 11 | VDD | 1 | 3 × ΔV |
| 10 | Vinput10 | | 2 × ΔV |
| 01 | Vinput01 | | 1 × ΔV |
| 00 | VSS | | 0 |
| Don't care | Don't care | 0 | 0 |

In FIG. 3, the first sharing switch N7 is used for charge sharing between the output bit lines GBL of two adjacent ones (e.g., 210_0 and 210_1) of a plurality of memory units 210_0-210_15. The second sharing switch N8 is used for charge sharing between the output bit line bar GBLB of the two adjacent ones of the memory units 210_0-210_15. The number of the memory units 210_0-210_15 is 16. Each of the memory units 210_0-210_15 is the same as the memory unit 210 of FIG. 2. In other words, in the two adjacent ones of the memory units 210_0-210_15, the output bit line GBL of one (e.g., 210_0) of the two adjacent ones of the memory units 210_0-210_15 is connected to the first sharing switch N7 of another (e.g., 210_1) of the two adjacent ones of the memory units 210_0-210_15. The output bit line bar GBLB of the one of the two adjacent ones of the memory units 210_0-210_15 is connected to the second sharing switch N8 of the another of the two adjacent ones of the memory units 210_0-210_15.

The input driver module 300 is connected to each of the local memory array units 200 via the first word line WL and the second word line HWL. The input driver module 300 includes a word line driver 310 and a CIM mode input driver 320. The word line driver 310 is represented by "WLDRV" and is located on a left side of the local memory array units 200. The word line driver 310 generates the voltage level of the first word line WL and the voltage level of the second word line HWL to control each of the local memory array units 200. The CIM mode input driver 320 is represented by "NN mode input driver" and is connected to each of the local memory array units 200 via the input bit line IN32 and the input bit line bar IN10. The CIM mode input driver 320 is located between the local memory array units 200 and the word line driver 310. The CIM mode input driver 320 generates the voltage level of the input bit line IN32 and the voltage level of the input bit line bar IN10 according to the multi-bit input values (IN[3:2] and IN[1:0]), respectively.

Moreover, the CIM mode input driver 320 generates the enable signal EN, the first switching signal ENS1 and the second switching signal ENS2 to the control computational cell 214.

The normal 10 circuit 400 is connected to each of the local memory array units 200 via the output bit line GBL and the output bit line bar GBLB. The normal 10 circuit 400 is represented by "Normal 10" and is located on a bottom side of the local memory array units 200. The normal 10 circuit 400 receives the weights from the local memory array units 200 via the output bit line GBL and the output bit line bar GBLB.

The readout combining unit 500 includes a combining switch 510 and a readout switch 520. The combining switch 510 is connected to one of the memory units 210. The combining switch 510 is coupled between the first sharing switch N7 and the second sharing switch N8 of the computational cell 214 of the one of the memory units 210 so as to perform a charge sharing between the output bit line GBL and the output bit line bar GBLB. The readout switch 520 has two ends. One of the two ends of the readout switch 520 is connected to the one of the memory units 210 and the combining switch 510. In other words, the one of the two ends of the readout switch 520 is connected to the first sharing switch N7 of the computational cell 214 of the one of the memory units 210. In one embodiment, each of the combining switch 510 and the readout switch 520 may be a transmission gate. The transmission gate includes a first combining transistor and a second combining transistor connected to the first combining transistor. The first combining transistor and the second combining transistor are controlled by a first enable combining signal EN_combine and a second enable combining signal EN_combineb, respectively. The first enable combining signal EN_combine is opposite to the second enable combining signal EN_combineb.

The CIM readout circuit 600 is represented by "NNIO" and is connected to another of the two ends of the readout switch 520. The CIM readout circuit 600 transfers the multi-bit output value to a multi-bit digital output value according to a reference voltage $V_{REF}$.

In the normal mode of FIGS. 2 and 4, the voltage level of the first word line WL and the voltage level of the second word line HWL are both set to 1, so that the weight in the memory cell 212 may be transmitted to the output bit line GBL via the local bit line LBL and the first computational cell transistor N1, and the inverted weight may be transmitted to the output bit line bar GBLB via the local bit line bar LBLB and the second computational cell transistor N2. Then, the weight and the inverted weight may be transmitted from each of the local memory array units 200 to the normal 10 circuit 400 via the output bit line GBL and the output bit line bar GBLB.

In the CIM mode of FIGS. 2 and 5, the voltage level of the first word line WL and the voltage level of the second word line HWL are set to 1 and 0, respectively, so that the first computational cell transistor N1 and the second computational cell transistor N2 are turned off. The voltage level of the enable signal EN is set to 1, so that the third computational cell transistor N3 and the fourth computational cell transistor N4 are turned on. The local bit line LBL may be used to control the fifth computational cell transistor N5 and the sixth computational cell transistor N6. Accordingly, the multi-bit output values of the output bit line GBL and the output bit line bar GBLB can be generated according to the weights of the local bit line LBL, the first word lines WL and the second word lines HWL of the word line driver 310 and the multi-bit input values of the input bit line IN32 and the input bit line bar IN10 of the CIM mode input driver 320. Therefore, the memory array structure 100 for the multi-bit CNN based CIM applications based on charge sharing of the present disclosure can reconfigure the cell array to several local memory array units 200 with the local bit line LBL and the local bit line bar LBLB, thereby preventing the write disturb issue. A plurality of different voltage levels (e.g., VDD, Vinput10, Vinput01 and VSS) of the multi-bit input values are utilized to precharge the parasitic capacitance of the output bit line GBL to different voltage levels which present different multi-bit output values, respectively. According to the memory array structure 100 of the present disclosure, a 4-bit input multiply-and-accumulate (MAC) operation can be parallelly performed, and the voltage level on a local capacitance may not be influenced by a global capacitance, so that it is good for sensing. In addition, the memory array structure 100 of the present disclosure does not need extra area to generate capacitance and does not generate large current so as to achieve small area and low power performance.

Figure 6:
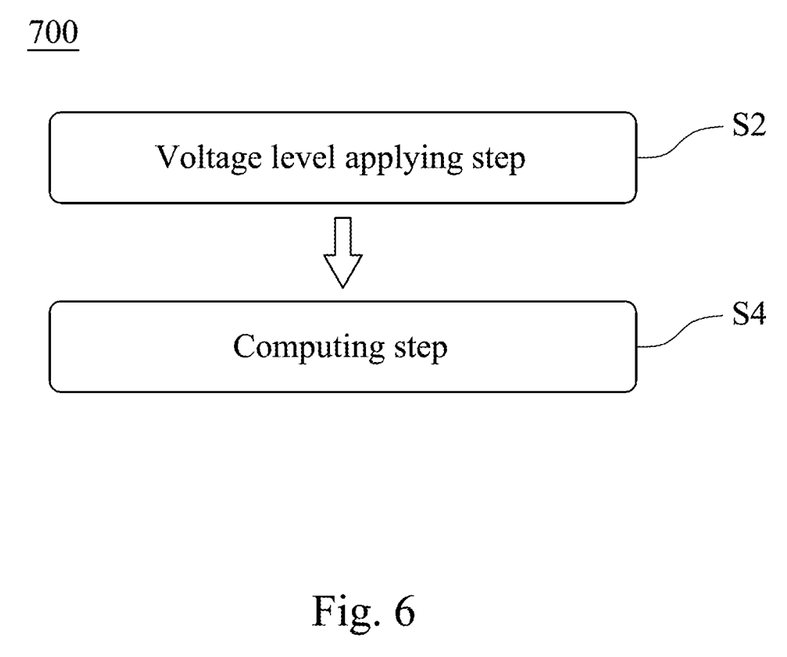
FIG. 6 shows a flow chart of a computing method of a memory array structure for a plurality of multi-bit convolutional neural network based computing-in-memory applications based on charge sharing according to a second embodiment of the present disclosure.
Figure 7:
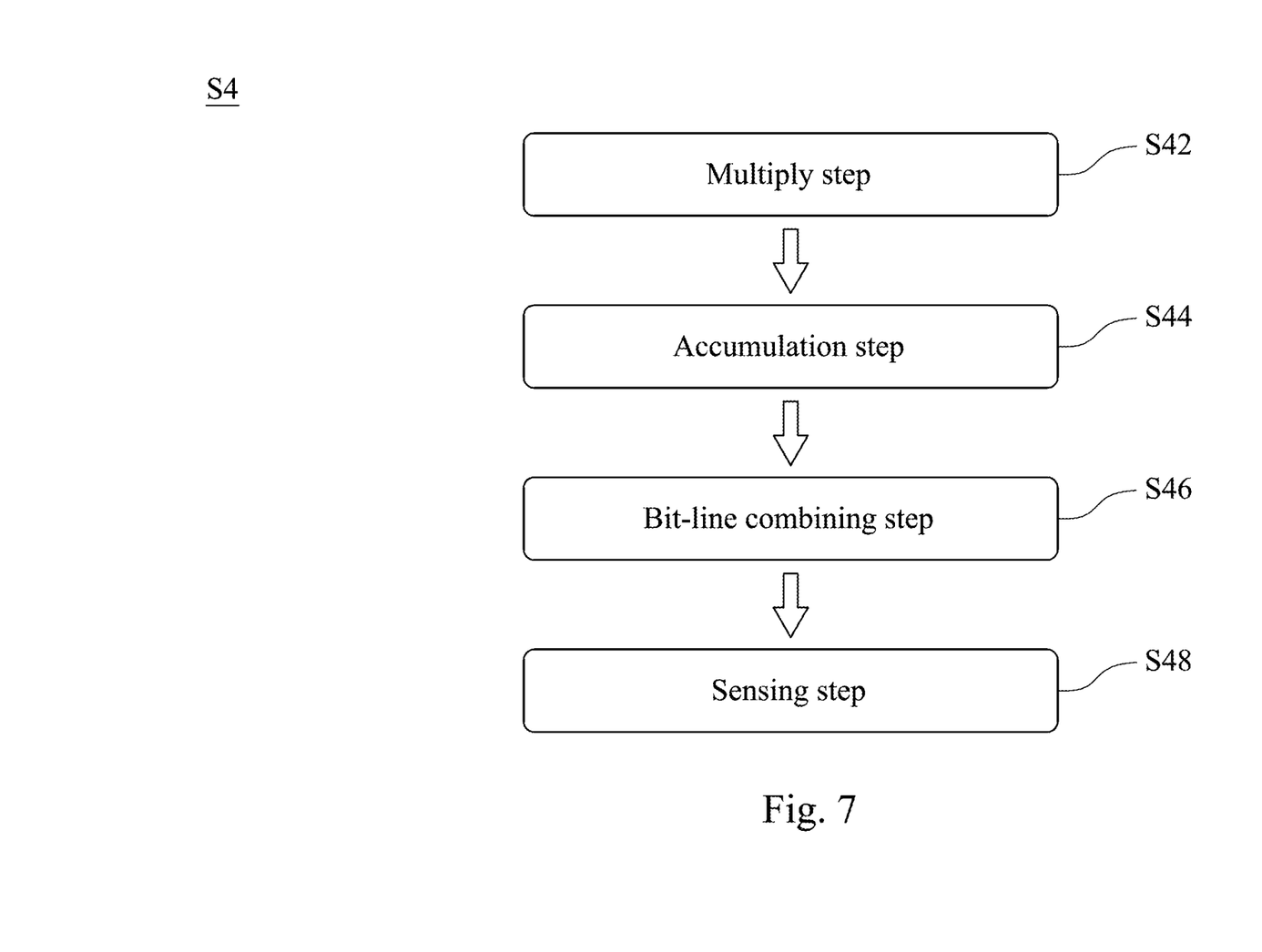
FIG. 7 shows a flow chart of a computing step of the computing method of the memory array structure for the multi-bit convolutional neural network based computing-in-memory applications based on charge sharing of FIG. 6.
Figure 8:
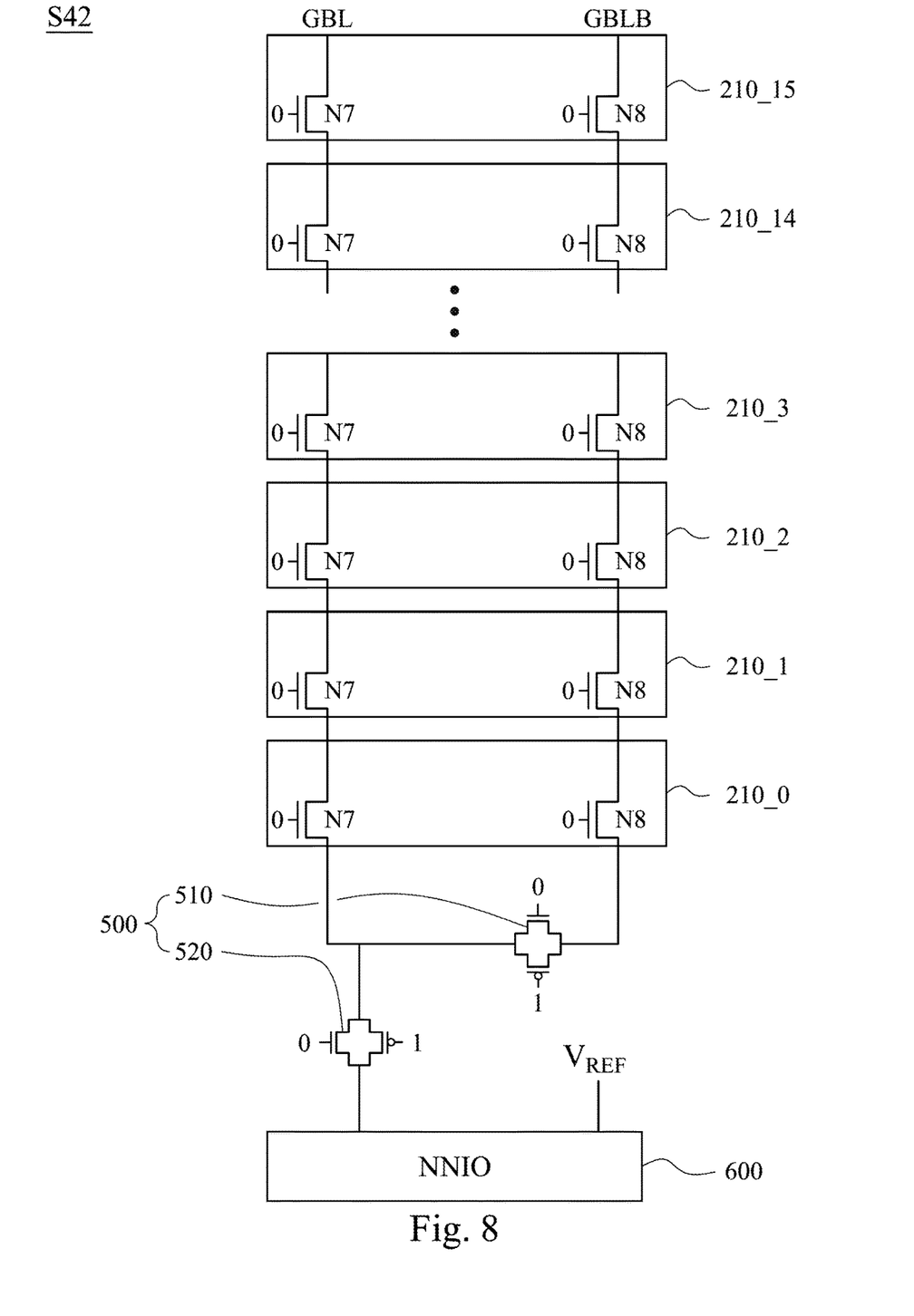
FIG. 8 shows a circuit diagram of a multiply step of the computing step of FIG. 7.
Figure 9:
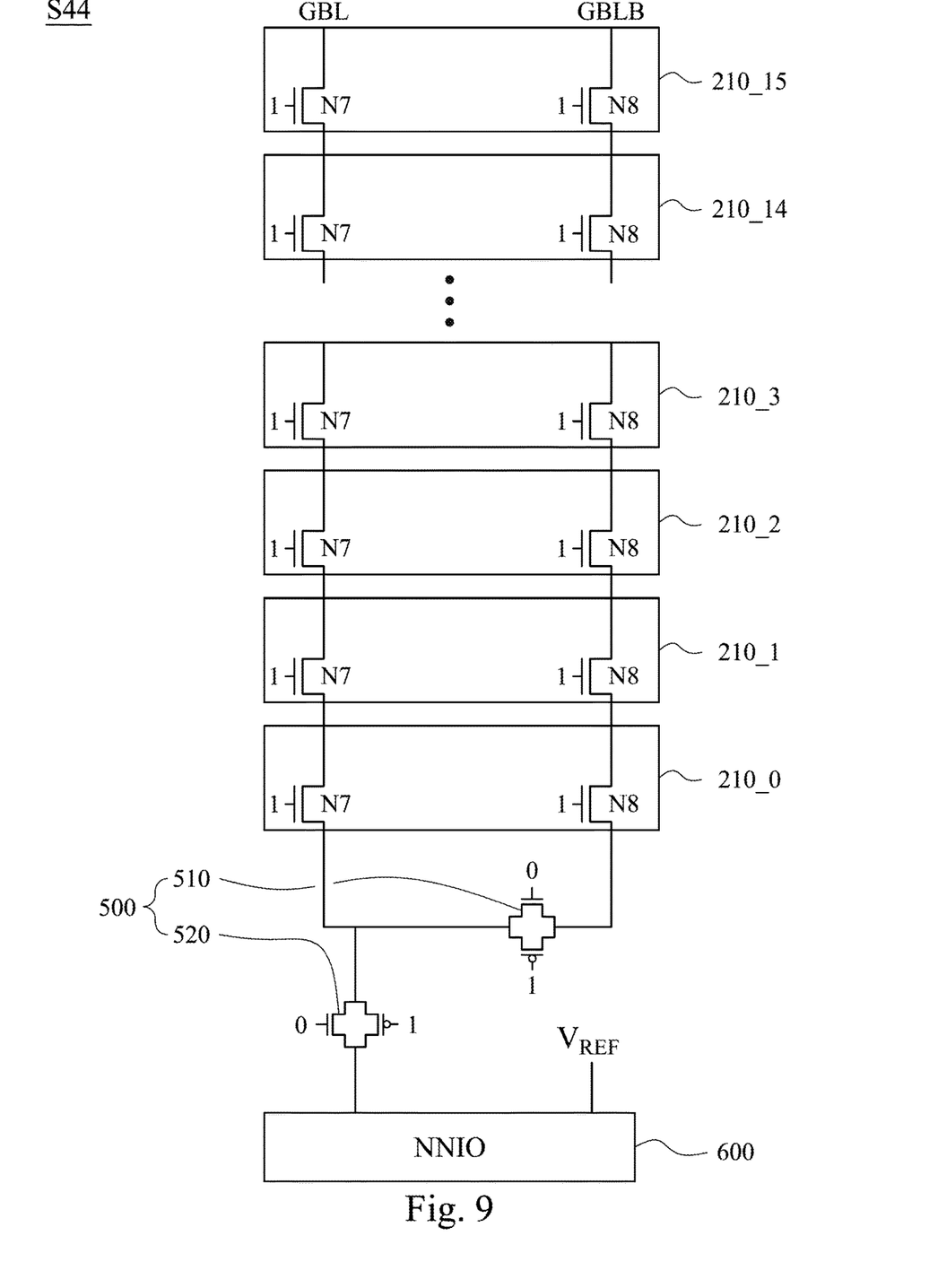
FIG. 9 shows a circuit diagram of an accumulation step of the computing step of FIG. 7.
Figure 10:
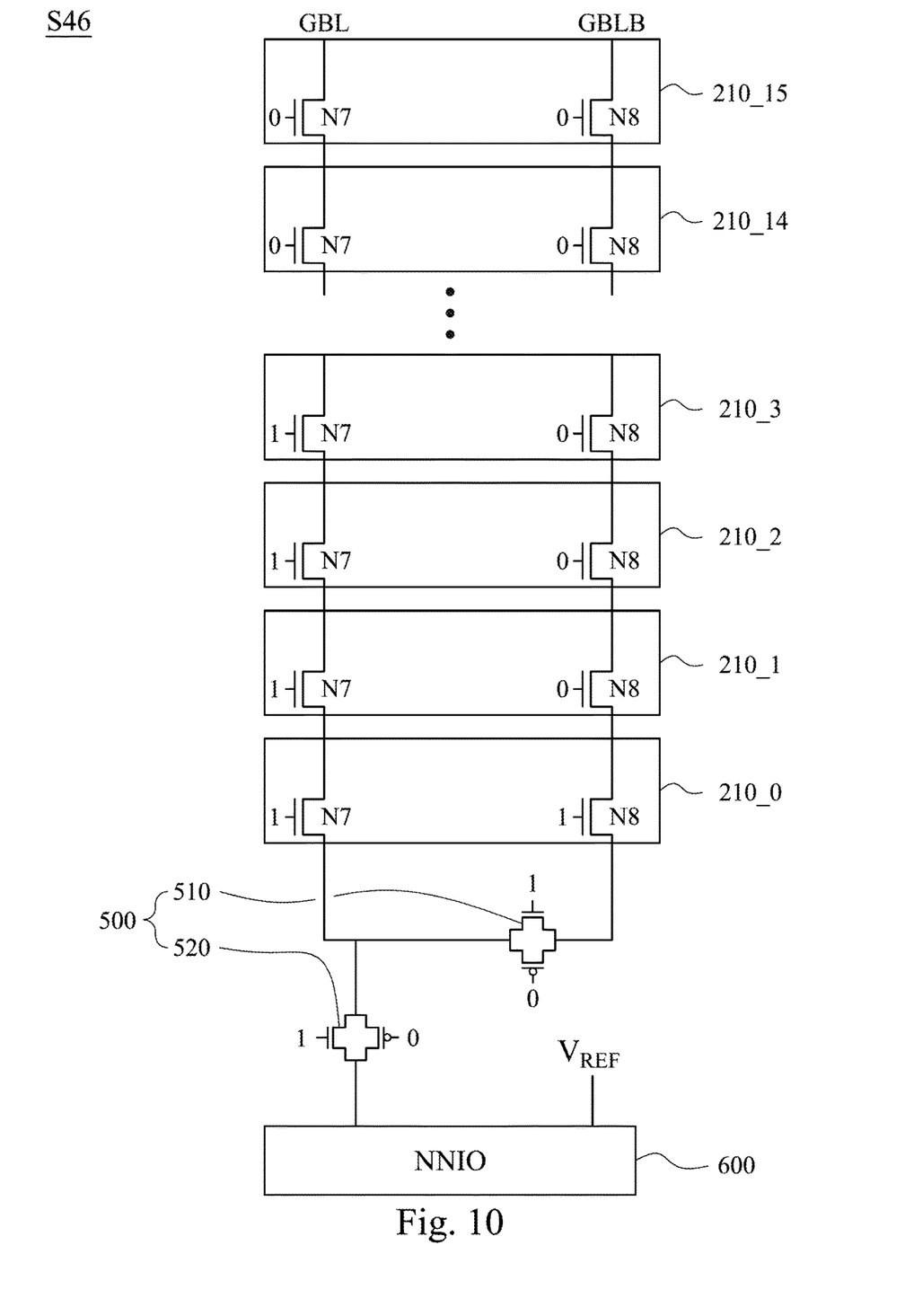
FIG. 10 shows a circuit diagram of a bit-line combining step of the computing step of FIG. 7.

FIG. 6 shows a flow chart of a computing method 700 of a memory array structure 100 (as shown in FIG. 1) for a plurality of multi-bit CNN based CIM applications based on charge sharing according to a second embodiment of the present disclosure. FIG. 7 shows a flow chart of a computing step S4 of the computing method 700 of the memory array structure 100 for the multi-bit CNN based CIM applications based on charge sharing of FIG. 6. FIG. 8 shows a circuit diagram of a multiply step S42 of the computing step S4 of FIG. 7. FIG. 9 shows a circuit diagram of an accumulation step S44 of the computing step S4 of FIG. 7. FIG. 10 shows a circuit diagram of a bit-line combining step S46 of the computing step S4 of FIG. 7. In FIGS. 6-10, the computing method 700 of the memory array structure 100 for the multi-bit CNN based CIM applications based on charge sharing is controlled by the first word line WL, the second word line HWL, the enable signal EN, the first switching signal ENS1 and the second switching signal ENS2. The computing method 700 includes a voltage level applying step S2 and a computing step S4.

The voltage level applying step S2 includes applying a plurality of voltage levels to the first word line WL, the second word line HWL, the enable signal EN, the first switching signal ENS1, the second switching signal ENS2, the weight, the input bit line IN32 and the input bit line bar IN10 of each of the memory units 210_0-210_15, respectively.

The computing step S4 includes a multiply step S42, an accumulation step S44, a bit-line combining step S46 and a sensing step S48. The multiply step S42 includes driving the computational cell 214 of each of the memory units 210_0-210_15 to compute the voltage levels of the weight, the input bit line IN32 and the input bit line bar IN10 so as to generate the multi-bit output value on each of the output bit line GBL and the output bit line bar GBLB according to the multi-bit input value multiplied by the weight. In the multiply step S42, the first switching signal ENS1 and the second switching signal ENS2 of each of the memory units 210_0-210_15 are both set to 0, so that the first sharing switch N7 and the second sharing switch N8 of each of the memory units 210_0-210_15 are turned off. The first enable combining signal EN_combine and the second enable combining signal EN_combineb are set to 0 and 1, respectively, so that the combining switch 510 and the readout switch 520 are turned off, as shown in FIG. 8.

The accumulation step S44 includes performing a first charge sharing among the output bit lines GBL of the memory units 210_0-210_15 via the first sharing switch N7 of each of the memory units 210_0-210_15, and performing a second charge sharing among the output bit line bars GBLB of the memory units 210_0-210_15 via the second sharing switch N8 of each of the memory units. The accumulation step S44 further includes turning on the first sharing switch N7 and the second sharing switch N8 of each of the memory units 210_0-210_15, and turning off the combining switch 510 and the readout switch 520. The first switching signal ENS1 and the second switching signal ENS2 of each of the memory units 210_0-210_15 are both set to 1. The first enable combining signal EN_combine and the second enable combining signal EN_combineb are set to 0 and 1, respectively, so that the combining switch 510 and the readout switch 520 are turned off, as shown in FIG. 9.

The bit-line combining step S46 includes performing a charge sharing between the output bit line GBL and the output bit line bar GBLB via the combining switch 510, and turning on the first sharing switch N7 and the second sharing switch N8 of a first part (e.g., 210_0) of the memory units 210_0-210_15. The bit-line combining step S46 further includes turning on the first sharing switch N7 of a second part (e.g., 210_1-210_03) of the memory units 210_0-210_15, and turning off the second sharing switch N8 of the second part of the memory units 210_0-210_15. The bit-line combining step S46 further includes turning off the first sharing switch N7 and the second sharing switch N8 of a third part (e.g., 210_4-210_15) of the memory units 210_0-210_15, and turning on the combining switch 510 and the readout switch 520. The first part of the memory units 210_0-210_15 is adjacent to the combining switch 510, and the second part of the memory units 210_0-210_15 is connected between the first part of the memory units 210_0-210_15 and the third part of the memory units 210_0-210_15. In addition, the first switching signal ENS1 and the second switching signal ENS2 of the first part (e.g., 210_0) of the memory units 210_0-210_15 are both set to 1. The first switching signal ENS1 and the second switching signal ENS2 of the second part (e.g., 210_1-210_03) of the memory units 210_0-210_15 are set to 1 and 0, respectively. The first switching signal ENS1 and the second switching signal ENS2 of the third part (e.g., 210_4-210_15) of the memory units 210_0-210_15 are both set to 0. The first enable combining signal EN_combine and the second enable combining signal EN_combineb are set to 1 and 0, respectively, so that the combining switch 510 and the readout switch 520 are turned on, as shown in FIG. 10.

The sensing step S48 includes performing sensing the multi-bit output value to generate a multi-bit digital output value via the CIM readout circuit 600 during a sensing period Ts.

Figure 11:
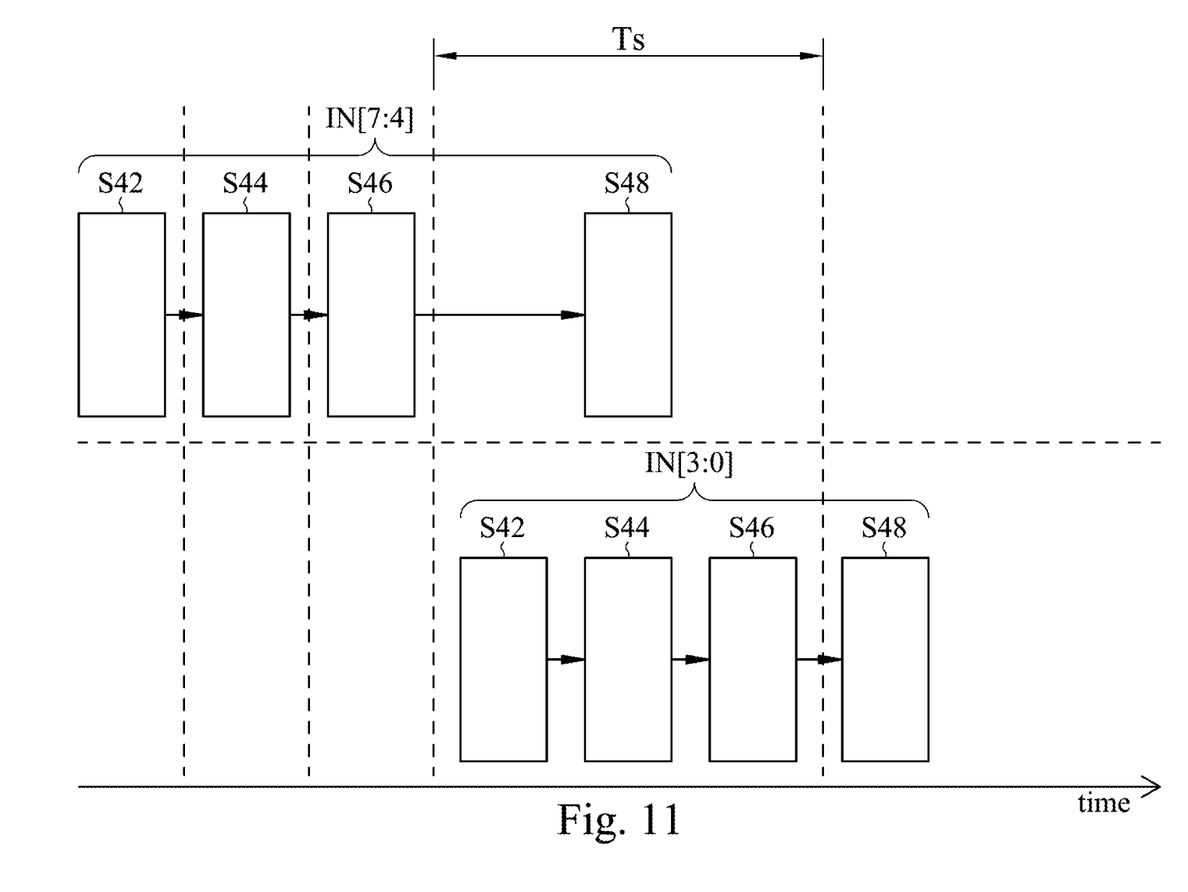
FIG. 11 shows a timing diagram associated with a computing method of a memory array structure for a plurality of multi-bit convolutional neural network based computing-in-memory applications based on charge sharing when the multi-bit input value is divided into two groups according to a third embodiment of the present disclosure.

FIG. 11 shows a timing diagram associated with a computing method 700 of a memory array structure 100 for a plurality of multi-bit CNN based CIM applications based on charge sharing when the multi-bit input value (e.g., IN[7:0]) is divided into two groups (e.g., IN[7:4] and IN[3:0]) according to a third embodiment of the present disclosure. In the sensing period Ts, the CIM readout circuit 600 is configured to perform a most significant bit (MSB) multi-bit sensing operation with a MSB multi-bit input value (e.g., IN[7:4]) of the multi-bit input value (e.g., IN[7:0]), and the memory units 210_0-210_15 are configured to perform a least significant bit (LSB) multi-bit computing operation with a LSB multi-bit input value (e.g., IN[3:0]) of the multi-bit input value. The MSB multi-bit sensing operation represents the sensing step S48 performed with the MSB multi-bit input value (IN[7:4]) of the multi-bit input value (IN[7:0]), and the LSB multi-bit computing operation represents the multiply step S42, the accumulation step S44 and the bit-line combining step S46 performed with the LSB multi-bit input value (IN[3:0]) of the multi-bit input value (IN[7:0]). Therefore, the computing method 700 of the present disclosure does not need extra capacitance and transistors by performing the accumulation step S44 and the bit-line combining step S46. Moreover, the computing method 700 of the present disclosure utilizes the specific control of the readout combining unit 500 to implement a pipeline technique so as to enhance the operation speed.

According to the aforementioned embodiments and examples, the advantages of the present disclosure are described as follows.

1. The memory unit for the multi-bit CNN based CIM applications based on charge sharing and memory array structure for the multi-bit CNN based CIM applications based on charge sharing of the present disclosure can reconfigure the cell array to several local memory array units with the local bit line and the local bit line bar, thereby preventing the write disturb issue. The different voltage levels of the multi-bit input values are utilized to precharge the parasitic capacitance of the output bit line GBL to different voltage levels which present different multi-bit output values, respectively. According to the memory array structure of the present disclosure, the 4-bit input MAC operation can be parallelly performed, and the voltage level on the local capacitance may not be influenced by the global capacitance, so that it is good for sensing. In addition, the memory array structure of the present disclosure does not need extra area to generate capacitance and does not generate large current so as to achieve small area and low power performance.

2. The computing method of the memory array structure for the multi-bit CNN based CIM applications based on charge sharing of the present disclosure does not need extra capacitance and transistors by performing the accumulation step and the bit-line combining step. Moreover, the computing method of the memory array structure for the multi-bit CNN based CIM applications based on charge sharing of the present disclosure utilizes the specific control of the readout combining unit to implement a pipeline technique so as to enhance the operation speed.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, wherein the memory device uses charge sharing for multi-bit convolutional neural network based computing-in-memory applications, and the memory device is controlled by a first word line, a second word line, an enable signal, a first switching signal, and a second switching signal, the memory device comprising:

at least one memory cell storing a weight, wherein the at least one memory cell is controlled by the first word line and comprises a local bit line transmitting the weight; and a computational cell connected to the at least one memory cell and receiving the weight via the local bit line, wherein the computational cell comprises an input bit line, an input bit line bar, an output bit line and an output bit line bar, each of the input bit line and the input bit line bar transmits a multi-bit input value, the computational cell is controlled by the second wordline and the enable signal to generate a multi-bit output value on each of the output bit line and the output bit line bar according to the multi-bit input value multiplied by the weight, and the computational cell is controlled by the first switching signal and the second switching signal for charge sharing.

2. The memory device of claim 1, wherein the at least one memory cell further comprises:

a first node storing the weight;

a second node storing an inverted weight opposite to the weight of the first node;

a local bit line bar connected to the computational cell and transmitting the inverted weight to the computational cell;

a first memory cell transistor connected to the first node, the local bit line and the first word line;

a second memory cell transistor connected to the second node, the local bit line bar and the first word line;

a first inverter located between the first node and the second node; and a second inverter connected to the first inverter.

3. The memory device of claim 2, wherein the computational cell further comprises:

a first computational cell transistor connected to the second word line, the output bit line and the local bit line;

a second computational cell transistor connected to the second word line, the output bit line bar and the local bit line bar;

a third computational cell transistor connected to the enable signal, the input bit line and a first inner node;

a fourth computational cell transistor connected to the enable signal, the input bit line bar and a second inner node;

a fifth computational cell transistor connected to the local bit line, the first inner node and the output bit line; and a sixth computational cell transistor connected to the local bit line, the second inner node and the output bit line bar.

4. The memory device of claim 1, wherein, the multi-bit input value is an analog signal;

the output bit line and the output bit line bar are extended in a vertical direction; and the first word line, the second word line, the input bit line and the input bit line bar are extended in a horizontal direction.

5. The memory device of claim 1, wherein the computational cell further comprises:

a first sharing switch coupled to one end of the output bit line, wherein the first sharing switch is controlled by the first switching signal for charge sharing; and a second sharing switch coupled to one end of the output bit line bar, wherein the second sharing switch is controlled by the second switching signal for charge sharing.

6. A memory array structure, wherein the memory array structure uses charge sharing for multi-bit convolutional neural network based computing-in-memory applications, and the memory array structure is controlled by a first word line, a second word line, an enable signal, a first switching signal, and a second switching signal, the memory array structure comprising:

a plurality of memory devices connected to each other via the first word line and the second word line, wherein each of the memory devices comprises:

at least one memory cell storing a weight, wherein the at least one memory cell is controlled by the first word line and comprises a local bit line transmitting the weight; and a computational cell connected to the at least one memory cell and receiving the weight via the local bit line, wherein the computational cell comprises an input bit line, an input bit line bar, an output bit line and an output bit line bar, each of the input bit line and the input bit line bar transmits a multi-bit input value, the computational cell is controlled by the second word line and the enable signal to generate a multi-bit output value on each of the output bit line and the output bit line bar according to the multi-bit input value multiplied by the weight, and the computational cell is controlled by the first switching signal and the second switching signal for charge sharing.

7. The memory array structure of claim 6, wherein the at least one memory cell further comprises:

a first node storing the weight;

a second node storing an inverted weight opposite to the weight of the first node;

a local bit line bar connected to the computational cell and transmitting the inverted weight to the computational cell;

a first memory cell transistor connected to the first node, the local bit line and the first word line;

a second memory cell transistor connected to the second node, the local bit line bar and the first word line;

a first inverter located between the first node and the second node; and a second inverter connected to the first inverter.

8. The memory array structure of claim 7, wherein the computational cell further comprises:

a first computational cell transistor connected to the second word line, the output bit line and the local bit line;

a second computational cell transistor connected to the second word line, the output bit line bar and the local bit line bar;

a third computational cell transistor connected to the enable signal, the input bit line and a first inner node;

a fourth computational cell transistor connected to the enable signal, the input bit line bar and a second inner node;

a fifth computational cell transistor connected to the local bit line, the first inner node and the output bit line; and a sixth computational cell transistor connected to the local bit line, the second inner node and the output bit line bar.

9. The memory array structure of claim 6, wherein, the multi-bit input value is an analog signal;

the output bit line and the output bit line bar are extended in a vertical direction; and the first word line, the second word line, the input bit line and the input bit line bar are extended in a horizontal direction.

10. The memory array structure of claim 6, wherein the computational cell further comprises:
a first sharing switch coupled to one end of the output bit line, wherein the first sharing switch is controlled by the first switching signal for charge sharing; and
a second sharing switch coupled to one end of the output bit line bar, wherein the second sharing switch is controlled by the second switching signal for charge sharing.

11. The memory array structure of claim 10, further comprising:
a combining switch connected to one of the memory devices, wherein the combining switch is coupled between the first sharing switch and the second sharing switch of the computational cell of the one of the memory devices so as to perform a charge sharing between the output bit line and the output bit line bar.

12. The memory array structure of claim 11, further comprising:
a readout switch having two ends, wherein one of the two ends is connected to the one of the memory devices and the combining switch.

13. The memory array structure of claim 12, further comprising:
a computing-in-memory readout circuit connected to another of the two ends of the readout switch, wherein the computing-in-memory readout circuit transfers the multi-bit output value to a multi-bit digital output value according to a reference voltage.

14. The memory array structure of claim 10, wherein in two adjacent ones of the memory devices,
the output bit line of one of the two adjacent ones of the memory devices is connected to the first sharing switch of another of the two adjacent ones of the memory devices; and
the output bit line bar of the one of the two adjacent ones of the memory devices is connected to the second sharing switch of the another of the two adjacent ones of the memory devices.

15. A computing method performed by a memory array structure, wherein the memory array structure uses charge sharing for multi-bit convolutional neural network based computing-in-memory applications, and the memory array structure is controlled by a first word line, a second word line, an enable signal, a first switching signal and a second switching signal, the computing method comprising:
performing a voltage level applying step, wherein the voltage level applying step comprises applying a plurality of voltage levels to the first word line, the second word line, the enable signal, the first switching signal, the second switching signal, a weight, an input bit line and an input bit line bar of each of a plurality of memory devices, respectively; and
performing a computing step, wherein the computing step comprises:
performing a multiply step, wherein the multiply step comprises driving a computational cell of each of the memory devices to compute the voltage levels of the weight, the input bit line and the input bit line bar so as to generate a multi-bit output value on each 15 of an output bit line and an output bit line bar according to a multi-bit input value multiplied by the weight, wherein the memory array structure comprises:
the memory devices connected to each other via the first word line and the second word line, wherein each of the memory devices comprises:
at least one memory cell storing the weight, wherein the at least one memory cell is controlled by the first word line and comprises a local bit line transmitting the weight; and
the computational cell connected to the at least one memory cell and receiving the weight via the local bit line, wherein the computational cell comprises the input bit line, the input bit line bar, the output bit line and the output bit line bar, each of the input bit line and the input bit line bar transmits the multi-bit input value, the computational cell is controlled by the second word line and the enable signal to generate the multi-bit output value on each of the output bit line and the output bit line bar according to the multi-bit input value multiplied by the weight, and the computational cell is controlled by the first switching signal and the second switching signal for charge sharing.

16. The computing method of claim 15, wherein the computational cell further comprises:
a first sharing switch coupled to one end of the output bit line, wherein the first sharing switch is controlled by the first switching signal for charge sharing; and
a second sharing switch coupled to one end of the output bit line bar, wherein the second sharing switch is controlled by the second switching signal for charge sharing.

17. The computing method of claim 16, wherein the memory array structure further comprises:
a combining switch connected to one of the memory devices, wherein the combining switch is coupled between the first sharing switch and the second sharing switch of the computational cell of the one of the memory devices;
a readout switch having two ends, wherein one of the two ends is connected to the one of the memory devices and the combining switch; and
a computing-in-memory readout circuit connected to another of the two ends of the readout switch.

18. The computing method of claim 17, wherein the computing step further comprises:
performing an accumulation step, wherein the accumulation step comprises:
performing a first charge sharing among the output bit lines of the memory devices via the first sharing switch of each of the memory devices;
performing a second charge sharing among the output bit line bars of the memory devices via the second sharing switch of each of the memory devices;
turning on the first sharing switch and the second sharing switch of each of the memory devices; and
turning off the combining switch and the readout switch;
wherein in the multiply step, the first sharing switch and the second sharing switch of each of the memory devices are turned off, and the combining switch and the readout switch are turned off.

19. The computing method of claim 17, wherein the computing step further comprises:
performing a bit-line combining step, wherein the bit-line combining step comprises:
performing a charge sharing between the output bit line and the output bit line bar via the combining switch;
turning on the first sharing switch and the second sharing switch of a first part of the memory devices;
turning on the first sharing switch of a second part of the memory devices;

turning off the second sharing switch of the second part of the memory devices;

turning off the first sharing switch and the second sharing switch of a third part of the memory devices; and turning on the combining switch and the readout switch;

wherein the first part of the memory devices is adjacent to the combining switch, and the second part of the memory devices is connected between the first part of the memory devices and the third part of the memory devices.

20. The computing method of claim 17, wherein the computing step further comprises:

performing a sensing step, wherein the sensing step comprises performing sensing the multi-bit output value to generate a multi-bit digital output value via the computing-in-memory readout circuit during a sensing period;

wherein in the sensing period, the computing-in-memory readout circuit is configured to perform a most significant bit multi-bit sensing operation with a MSB multi-bit input value of the multi-bit input value, and the memory units devices are configured to perform a least significant bit multi-bit computing operation with a LSB multi-bit input value of the multi-bit input value;

wherein the MSB multi-bit sensing operation represents the sensing step performed with the MSB multi-bit input value of the multi-bit input value, and the LSB multi-bit computing operation represents the multiply step, an accumulation step and a bit-line combining step performed with the LSB multi-bit input value of the multi-bit input value.

\* \* \* \* \*